(12) United States Patent  
Zenou et al.

(10) Patent No.: US 10,688,692 B2  
(45) Date of Patent: Jun. 23, 2020

(54) CONTROL OF SURFACE PROPERTIES OF PRINTED THREE-DIMENSIONAL STRUCTURES

(71) Applicant: Orbotech Ltd., Yavne (IL)

(72) Inventors: Michael Zenou, Hashmonaim (IL); Zvi Kotler, Tel Aviv (IL)

(73) Assignee: ORBOTECH LTD., Yavne (IL)

( * ) Notice: Subject to any disclaimer, the term of this patent is extended or adjusted under 35 U.S.C. 154(b) by 8 days.

(21) Appl. No.: 15/763,451

(22) PCT Filed: Nov. 1, 2016

(86) PCT No.: PCT/IL2016/051180  
§ 371 (c)(1),  
(2) Date: Mar. 27, 2018

(87) PCT Pub. No.: WO2017/085712  
PCT Pub. Date: May 26, 2017

(65) Prior Publication Data  
US 2018/0281243 A1  Oct. 4, 2018

Related U.S. Application Data

(60) Provisional application No. 62/258,468, filed on Nov. 22, 2015.

(51) Int. Cl.  
*B29C 41/08* (2006.01)  
*B22C 9/00* (2006.01)  
(Continued)

(52) U.S. Cl.  
CPC .............. *B29C 41/08* (2013.01); *B22C 9/00* (2013.01); *B22D 23/003* (2013.01); *B22D 29/00* (2013.01);  
(Continued)

(58) Field of Classification Search  
None  
See application file for complete search history.

(56) References Cited

U.S. PATENT DOCUMENTS 3,963,852 A  6/1976 Baxter  
4,752,455 A  6/1988 Mayer  
(Continued)

FOREIGN PATENT DOCUMENTS

DE  10237732 A1  3/2004  
DE  102012003866 B4  7/2013  
(Continued)

OTHER PUBLICATIONS

U.S. Appl. No. 15/537,885 office action dated Jun. 19, 2019.  
(Continued)

*Primary Examiner* — Shamim Ahmed  
(74) *Attorney, Agent, or Firm* — Kligler & Associates Patent Attorneys Ltd

(57) ABSTRACT

A method for fabrication includes providing a substrate having an upper surface with pattern of one or more recesses formed therein. A laser beam is directed to impinge on a donor film so as to eject droplets of a fluid from the donor film by laser-induced forward transfer (LIFT) into the one or more recesses. The fluid hardens within the one or more recesses to form a solid piece having a shape defined by the one or more recesses. The substrate is removed from the solid piece. In some embodiments, the recesses are coated with a thin-film layer before ejecting the droplets into the recesses, such that the thin-film layer remains as an outer surface of the solid piece after removing the substrate.

26 Claims, 4 Drawing Sheets

(51) Int. Cl.
  *B44C 1/22* (2006.01)
  *B29C 33/38* (2006.01)
  *G03F 7/00* (2006.01)
  *B22D 23/00* (2006.01)
  *B22D 29/00* (2006.01)
  *B29C 37/00* (2006.01)
  *B29C 41/42* (2006.01)
  *B29C 41/46* (2006.01)

(52) U.S. Cl.
  CPC .......... *B29C 33/38* (2013.01); *B29C 37/0025* (2013.01); *B29C 41/42* (2013.01); *B29C 41/46* (2013.01); *G03F 7/0002* (2013.01)

(56) References Cited

U.S. PATENT DOCUMENTS

| | | | |
|---|---|---|---|
| 4,891,183 A | 1/1990 | Corwin | |
| 4,895,735 A | 1/1990 | Cook | |
| 4,931,323 A | 6/1990 | Manitt et al. | |
| 4,970,196 A | 11/1990 | Kim et al. | |
| 4,977,038 A | 12/1990 | Sieradzki et al. | |
| 4,987,006 A | 1/1991 | Williams et al. | |
| 5,173,441 A | 12/1992 | Yu et al. | |
| 5,292,559 A | 3/1994 | Joyce, Jr. et al. | |
| 5,308,737 A | 5/1994 | Bills et al. | |
| 5,492,861 A | 2/1996 | Opower | |
| 5,683,601 A | 11/1997 | Tatah | |
| 5,725,914 A | 3/1998 | Opower | |
| 5,935,758 A | 8/1999 | Patel et al. | |
| 6,025,110 A | 2/2000 | Nowak | |
| 6,155,330 A | 12/2000 | Kinane et al. | |
| 6,159,832 A | 12/2000 | Mayer | |
| 6,177,151 B1 | 1/2001 | Chrisey et al. | |
| 6,261,493 B1 | 1/2001 | Gaylo et al. | |
| 6,348,295 B1 | 2/2002 | Griffith et al. | |
| 6,412,143 B1 | 7/2002 | Chen | |
| 6,440,503 B1 | 8/2002 | Merdan et al. | |
| 6,583,381 B1 | 6/2003 | Duignan | |
| 6,600,457 B2 | 7/2003 | Heinz et al. | |
| 6,649,861 B2 | 11/2003 | Duignan | |
| 6,792,326 B1 | 9/2004 | Duignan et al. | |
| 6,805,918 B2 | 10/2004 | Auyeung et al. | |
| 6,815,015 B2 | 11/2004 | Young et al. | |
| 6,822,189 B2 | 11/2004 | Hong et al. | |
| 6,899,988 B2 | 5/2005 | Kidnie et al. | |
| 6,921,626 B2 | 7/2005 | Ray et al. | |
| 7,236,334 B2 | 6/2007 | Ding et al. | |
| 7,277,770 B2 | 10/2007 | Huang et al. | |
| 7,294,449 B1 | 11/2007 | Gudeman et al. | |
| 7,358,169 B2 | 4/2008 | Zhu et al. | |
| 7,364,996 B2 | 4/2008 | Kawase et al. | |
| 7,423,286 B2 | 9/2008 | Handy et al. | |
| 7,534,544 B2 | 5/2009 | Principe et al. | |
| 7,608,308 B2 | 10/2009 | Liu et al. | |
| 7,784,173 B2 | 8/2010 | Wolkin et al. | |
| 7,799,699 B2 | 9/2010 | Nuzzo et al. | |
| 7,938,855 B2 | 5/2011 | Gregorich et al. | |
| 7,942,987 B2 | 5/2011 | Crump et al. | |
| 7,982,296 B2 | 9/2011 | Nuzzo et al. | |
| 8,025,542 B2 | 9/2011 | Birrell et al. | |
| 8,056,222 B2 | 11/2011 | Pique et al. | |
| 8,215,371 B2 | 7/2012 | Batchelder | |
| 8,216,931 B2 * | 7/2012 | Zhang .................. | B81C 1/0019 438/49 |
| 8,221,822 B2 | 7/2012 | Flanagan et al. | |
| 8,262,916 B1 | 9/2012 | Smalley et al. | |
| 8,395,083 B2 | 3/2013 | Naveh et al. | |
| 8,420,978 B2 | 4/2013 | Jain et al. | |
| 8,440,546 B2 | 5/2013 | Nuzzo et al. | |
| 8,535,041 B2 | 9/2013 | Slafer | |
| 8,545,931 B2 | 10/2013 | Szuch | |
| 8,574,615 B2 | 11/2013 | Tenney et al. | |
| 8,729,524 B2 | 5/2014 | Rogers et al. | |
| 8,741,194 B1 | 6/2014 | Ederer et al. | |
| 8,743,165 B2 | 6/2014 | Sandstriim | |
| 9,027,378 B2 | 5/2015 | Crump et al. | |
| 9,029,058 B2 | 5/2015 | Martin | |
| 9,044,805 B2 | 6/2015 | Prest et al. | |
| 9,446,618 B2 | 9/2016 | Batt et al. | |
| 9,925,797 B2 | 3/2018 | Kotler et al. | |
| 2002/0085085 A1 | 7/2002 | Fischer et al. | |
| 2003/0006534 A1 | 1/2003 | Taboas et al. | |
| 2004/0069471 A1 | 4/2004 | Corduan et al. | |
| 2004/0233408 A1 | 11/2004 | Sievers | |
| 2004/0241585 A1 | 12/2004 | Kato et al. | |
| 2005/0056626 A1 | 3/2005 | Gross et al. | |
| 2005/0095367 A1 | 5/2005 | Babiarz et al. | |
| 2005/0112015 A1 | 5/2005 | Bampton | |
| 2005/0211163 A1 | 9/2005 | Li et al. | |
| 2005/0212888 A1 | 9/2005 | Lehmann et al. | |
| 2006/0076584 A1 | 4/2006 | Kim et al. | |
| 2007/0203584 A1 | 8/2007 | Bdyopadhyay et al. | |
| 2007/0274028 A1 | 11/2007 | Hsu et al. | |
| 2008/0006966 A1 | 1/2008 | Mannella | |
| 2008/0041725 A1 | 2/2008 | Klein et al. | |
| 2008/0233291 A1 | 9/2008 | Chandrasekaran | |
| 2008/0245968 A1 | 10/2008 | Tredwell et al. | |
| 2008/0286488 A1 | 11/2008 | Li et al. | |
| 2008/0314881 A1 | 12/2008 | Ringeisen et al. | |
| 2009/0074987 A1 | 3/2009 | Auyeung et al. | |
| 2009/0130427 A1 | 5/2009 | Grigoropoulos et al. | |
| 2009/0130467 A1 | 5/2009 | Liu et al. | |
| 2009/0217517 A1 | 9/2009 | Pique et al. | |
| 2010/0021638 A1 | 1/2010 | Varanka et al. | |
| 2010/0022078 A1 | 1/2010 | Rockenberger et al. | |
| 2010/0035375 A1 | 2/2010 | Grigoropoulos et al. | |
| 2010/0100635 A1 | 9/2010 | Gold et al. | |
| 2011/0003246 A1 | 1/2011 | Kurok | |
| 2011/0097550 A1 | 4/2011 | Matusovsky et al. | |
| 2011/0136162 A1 | 6/2011 | Sun et al. | |
| 2011/0188016 A1 | 8/2011 | De Jager et al. | |
| 2011/0278269 A1 | 11/2011 | Gold et al. | |
| 2012/0015112 A1 | 1/2012 | Yang et al. | |
| 2012/0025182 A1 | 2/2012 | Umeda et al. | |
| 2012/0080088 A1 | 4/2012 | Grabitz et al. | |
| 2012/0244321 A1 | 9/2012 | Hsu et al. | |
| 2012/0247740 A1 | 10/2012 | Gertner et al. | |
| 2013/0011562 A1 | 1/2013 | Varanka et al. | |
| 2013/0029480 A1 | 1/2013 | Niklaus et al. | |
| 2013/0037838 A1 | 2/2013 | Speier et al. | |
| 2013/0176699 A1 | 7/2013 | Tonchev et al. | |
| 2013/0302154 A1 | 11/2013 | Finlayson | |
| 2013/0313756 A1 | 11/2013 | Chen et al. | |
| 2013/0335504 A1 | 12/2013 | Sandstrom et al. | |
| 2014/0001675 A1 * | 1/2014 | Nakamura ............. | B82Y 10/00 264/293 |
| 2014/0097277 A1 | 4/2014 | Kumta et al. | |
| 2014/0160452 A1 | 6/2014 | De Jager et al. | |
| 2014/0231266 A1 | 8/2014 | Sherrer et al. | |
| 2014/0238574 A1 | 8/2014 | Kinser et al. | |
| 2015/0001093 A1 | 1/2015 | Carter et al. | |
| 2015/0024317 A1 | 1/2015 | Orrock et al. | |
| 2015/0024319 A1 | 1/2015 | Martin | |
| 2015/0086705 A1 | 3/2015 | Meinders et al. | |
| 2015/0197063 A1 | 7/2015 | Shinar et al. | |
| 2015/0197862 A1 | 7/2015 | Engel et al. | |
| 2015/0203984 A1 | 7/2015 | Zhang et al. | |
| 2015/0294872 A1 | 10/2015 | Molpeceres Alvarez et al. | |
| 2015/0097316 A1 | 12/2015 | Desimone et al. | |
| 2015/0382476 A1 | 12/2015 | Zenou et al. | |
| 2016/0218287 A1 | 7/2016 | McAlpine et al. | |
| 2016/0233089 A1 | 8/2016 | Zenou et al. | |
| 2016/0336303 A1 | 11/2016 | Tsai | |
| 2017/0021014 A1 | 1/2017 | Boger | |
| 2017/0189995 A1 | 7/2017 | Zenou et al. | |
| 2017/0210142 A1 | 7/2017 | Kotler et al. | |
| 2017/0250294 A1 | 8/2017 | Zenou et al. | |
| 2017/0365484 A1 | 12/2017 | Kotler et al. | |

FOREIGN PATENT DOCUMENTS

| | | | |
|---|---|---|---|
| EP | 1847632 A1 | 10/2007 | |
| EP | 2299784 A1 | 3/2011 | |

(56) References Cited

FOREIGN PATENT DOCUMENTS

| | | |
|---|---|---|
| EP | 2660352 A1 | 11/2013 |
| EP | 3166143 A1 | 5/2017 |
| GB | 2453774 A | 4/2009 |
| JP | S61260603 A | 11/1986 |
| JP | H04269801 A | 9/1992 |
| JP | 0634283 A | 2/1994 |
| JP | H0634283 A | 2/1994 |
| JP | 11337227 A | 12/1999 |
| JP | 3871096 B2 | 1/2007 |
| JP | 2015144252 A | 8/2015 |
| WO | 2003056320 A2 | 7/2003 |
| WO | 2007134300 A2 | 11/2007 |
| WO | 2009029119 A1 | 3/2009 |
| WO | 2009062754 A1 | 5/2009 |
| WO | 2009081355 A2 | 7/2009 |
| WO | 2009153792 A2 | 12/2009 |
| WO | 2010100635 A1 | 9/2010 |
| WO | 2012066338 A2 | 5/2012 |
| WO | 2013023874 A1 | 2/2013 |
| WO | 2013037838 A1 | 3/2013 |
| WO | 2013080030 A1 | 6/2013 |
| WO | 2013124114 A1 | 8/2013 |
| WO | 2013165241 A1 | 11/2013 |
| WO | 2014061024 A1 | 4/2014 |
| WO | 2015056253 A1 | 4/2015 |
| WO | 2015155662 A1 | 10/2015 |
| WO | 2015181810 A1 | 12/2015 |
| WO | 2016063270 A1 | 4/2016 |
| WO | 2016116921 A1 | 7/2016 |
| WO | 2016124712 A2 | 8/2016 |
| WO | 2017006306 A1 | 1/2017 |
| WO | 2017085712 A1 | 5/2017 |

OTHER PUBLICATIONS

Janikowski et al., "Noncyanide Stripper Placement Program", Department of the Air Force, Air force Engineering & Services Center, Engineering & Services Laboratory, pp. 110-114, May 1989.

Chinese Patent Application No. 201680005719.1 office action dated Aug. 14, 2019.

Pique et al., "Laser Forward Transfer of Electronic and Power Generating Materials", Laser Ablation and its Applications, Chapter 14, pp. 339-373, Dec. 31, 2007.

Young et al., "Dielectric properties of oxide structures by a laser-based direct-writing method", Journal of Materials Research, vol. 16, number, pp. 1720-1725, Jun. 30, 2001.

Nagel et al., "Laser-Induced Forward Transfer for the Fabrication of Devices", Nanomaterials: Processing and Characterization with Lasers, First Edition, pp. 255-316, year 2012.

Papavlu et al.,"Laser Induced Forward Transfer for Materials Patterning", Romanian Reports in Physics, vol. 63, supplement, pp. 1285-1301, year 2011.

Zergioti et al., "Microdeposition of metals by femtosecond excimer lase", Applied Surface Science, vols. 127-129, pp. 601-605, year 1998.

Vispute et al., "Reactive deposition of YlBa2Cu30 7-x superconductor films by pulsed laser ablation from an unreacted mixture of Y203, BaCO 3 and CuO", Bulletin of Materials Science, vol. 15, No. 4, pp. 377-384, Aug. 1992.

Hecht.,"Multifrequency Acoustooptic Diffraction," IEEE Transactions on Sonics and Ultrasonics, vol. SU-24, No. 1, pp. 7-18, year 1977.

Trypogeorgos et al., "Precise shaping of laser light by an acousto-optic deflector", Optics Express, vol. 21, No. 21, pp. 24837-24846, Oct. 21, 2013.

Tan et al., "Selective surface texturing using femtosecond pulsed laser induced forward transfer", Applied Surface Scienc, vol. 207, pp. 365-371, year 2003.

Adrian et al., "A study of the mechanism of metal deposition by the laser-induced forward transfer process", Journal of Vacuum Science and Technology B, vol. 5, No. 5, pp. 1490-1494, Sep./Oct. 1987.

Baseman.,"Formation of Metal Silicon Alloys by Laser Induced Forward Transfer", An IP.com Prior Art Database Technical Disclosure, 2 pages, Jul. 1, 1988.

Gehner., "MEMS Adaptive Optics Development at IPMS", Fraunhofer, Feb. 15, 2007.

Kumpulainen et al., "Low Temperature Nanoparticle Sintering with Continuous Wave and Pulse Lasers", Optics & Laser Technology 43, pp. 570-576, year 2011.

Theodorakos et al., "Selective Laser Sintering of Ag Nanoparticles Ink for Applications in Flexible Electronics", Applied Surface Science 336, pp. 157-162, 2015.

Wang et al., "Silicon solar cells based on all-laser-transferred contacts", Progress in Photovoltaics: Research and Applications, 23, pp. 61-68 Jul. 19, 2013.

Willis et al., "Microdroplet deposition by laser-induced forward transfer", Applied Physics Letters, vol. 86, pp. 244103-1-244103-3, year 2005.

Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.

Banks et al., "Nanodroplets deposited in microarrays by femtosecond Ti:sapphire laser-induced forward transfer", Applied Physics Letters, vol. 89, pp. 193107-1-193107-3, year 2006.

Antonov., "Acoustooptic Nonpolar Light Controlling Devices and Polarization Modulators Based on Paratellurite Crystals", Technical Physics, vol. 49, No. 10, pp. 1329-1334, year 2004.

Antonov et al., "Improving the Efficiency of an Acoustooptic Modulator with a Two-Lobe Directivity Pattern by Correcting the Two-Frequency Electric Signal", ISSN 1063-7842, Technical Physics, vol. 51, No. 1, pp. 57-62, year 2006.

Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.

Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.

Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.

Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.

Antonov et al., "Switch multiplexer of fiber-optic channels based on multibeam acousto-optic diffraction", Applied Optics, vol. 48, No. 7, pp. C171-C181, Mar. 1, 2009.

Zenou et al., "Laser Transfer of Metals and Metal Alloys for Digital Microfabrication of 3D Objects", SMALL, vol. 11, issue 33, pp. 4082-4089, Sep. 2, 2015.

Zenou et al., "Solar cell metallization by laser transfer of metal micro-droplets", ScienceDirect, Energy Procedia, vol. 67, pp. 147-155, year 2015.

Bera et al., "Optimization study of the femtosecond laser-induced forward-transfer process with thin aluminum films", Applied Optics, vol. 46, No. 21, pp. 4650-4659, Jul. 20, 2007.

Li et al., "Microdroplet deposition of copper film by femtosecond laser-induced forward transfer", Applied Physics Letters, vol. 89, pp. 161110-4-161110-4, year 2006.

Roder et al., "Low Temperature Laser Metallization for Silicon Solar Cells", ScienceDirect, Energy Procedia, vol. 8, pp. 552-557, year 2011.

Tien et al., "Precision laser metallization", Microelectronic Engineering, vol. 56, pp. 273-279, year 2001.

Fraunhofer IPMS, Spatial Light Modulators (SLM), 2 pages, Jun. 7, 2016.

Fraunhofer IPMS, "Micro Mirror Arrays (MMA) from DUV to NIR", 2 pages, Jun. 7, 2016.

Gehner et al., "Mems AO Micro Mirror Development at IPMS", Status and Perspectives, Fraunhofer IPMS, 30 pages, May 4, 2016.

BWT Beijing, "K915FG2RN-150.0W, 915nm 150W High Power Fiber Coupled Diode Laser", 4 pages, Jul. 1, 2016.

(56) References Cited

OTHER PUBLICATIONS

Zenou et al., "Digital laser printing of aluminum microstructure on thermally sensitive substrates", Journal of Physics D: Applied Physics 48, 205303 12 pages, 2015.
Willis et al., "The effect of melting-induced volumetric expansion on initiation of laser-induced forward transfer", Applied Surface Science 253, pp. 4759-4763, 2007.
Schultze et al., "Laser-induced forward transfer of aluminium", Applied Surface Science 52, pp. 303-309, 1991.
Pique, A., "Laser Transfer Techniques for Digital Microfabrication", vol. 135 of the series Springer Series in Materials Science, Chapter 11, pp. 259-291, Jun. 30, 2010.
Bohandy et al., "Metal deposition from a supported metal film using an excimer laser", Journal of Applied Physics, vol. 60, No. 4, pp. 1538-1539, Aug. 15, 1986.
Komorita et al., "Oxidation state control of micro metal oxide patterns produced by using laser-induced forward transfer technique", Proceedings of 3rd International Symposium on Laser Precision Microfabrication, vol. 4830, pp. 20-24, Feb. 19, 2003.
Pique., "A novel laser transfer process for direct writing of electronic and sensor materials", Applied Physics A, Issue 69, No. 7, pp. S279-S284, year 1999.
U.S. Appl. No. 15/313,569 office action dated Feb. 26, 2019.
JP Application # 2016-568049 office action dated Apr. 2, 2019.
Baseman et al., "Laser Induced Forward Transfer", Materials research society symposium proceedings, vol. 101, pp. 237-242, year 1988.
Toth et al., "Laser-induced compound formation and transfer of stacked elemental layers", Thin Solid Films, vol. 245, issues 1-2, pp. 40-43, Jun. 1, 1994.
Emeric et al., "Multi-jets formation using laser forward transfer", Applied Surface Science, vol. 302, pp. 153-158, year 2014.
Fardel et al., Laser-Induced Forward Transfer of Organic Led Building Blocks Studied by Time-Resolved Shadowgraphy, The journal of Physical Chemistry, vol. 114, issue 12, pp. 5617-5636, year 2010.
Zhang., "Functional Material and Application Thereof", China Machine Press, 5 pages (relevant pp. 86-87), Jan. 2009 (only abstract is available in English).
European Application # 15852999 search report dated May 11, 2018.
European Application # 14853466 search report dated Jul. 7, 2018.
European Application # 14751180 search report dated Nov. 9, 2016.
Biver et al., "Multi-jets formation using laser forward transfer", Applied Surface Science, vol. 302, pp. 153-158, May 30, 2014.
Pique et al., "Laser Direct-Write of Embedded Electronic Components and Circuits", In Photon processing in Microelectronics and Photonics IV, vol. 5713, pp. 223-231, Apr. 1, 2005.
Barnett et al., "Integrating Electronics", 7 pages, Feb. 4, 2017.
International Application # PCT/IL2018/050455 search report dated Jul. 30, 2018.
European Application # 16739878 search report dated Jan. 2, 2018.
Vaezi et al., "A review on 3D micro-additive manufacturing technologies", The International Journal of Advanced Manufacturing Technology, vol. 67, issue 5-8, pp. 1721-1754, Jul. 2013.
Pique, A., "Rapid Prototyping of Embedded Microelectronics by Laser Direct-Write", Rapid Prototyping Technology—Principles and Functional Requirements, Chapter 12, pp. 247-272, Sep. 2011.
International Application PCT/IL2016/051180 Search Report dated Jan. 29, 2017.

\* cited by examiner

CONTROL OF SURFACE PROPERTIES OF PRINTED THREE-DIMENSIONAL STRUCTURES

FIELD OF THE INVENTION

The present invention relates generally to printing of three-dimensional structures, and particularly to controlling properties of structures created on a substrate by injection of material into a mold.

BACKGROUND

In laser direct-write (LDW) techniques, a laser beam is used to create a patterned surface with spatially-resolved three-dimensional (3D) structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier before the photons are absorbed by the inner surface of the film. Above a certain energy threshold, material is ejected from the donor film toward the surface of the substrate, which is generally placed, in LIFT systems that are known in the art, either in close proximity to or even in contact with the donor film. The applied laser energy can be varied in order to control the thrust of forward propulsion that is generated within the irradiated film volume. Nagel and Lippert provide a useful survey of the principles and applications of LIFT in micro-fabrication in "Laser-Induced Forward Transfer for the Fabrication of Devices," published in *Nanomaterials: Processing and Characterization with Lasers*, Singh et al., eds. (Wiley-VCH Verlag GmbH & Co. KGaA, 2012), pages 255-316.

LIFT techniques using metal donor films have been developed for a variety of applications, such as repair of electrical circuits. For example, PCT International Publication WO 2010/100635, whose disclosure is incorporated herein by reference, describes a system and method of repairing electrical circuits in which a laser is used to pre-treat a conductor repair area of a conductor formed on a circuit substrate. The laser beam is applied to a donor substrate in a manner that causes a portion of the donor substrate to be detached therefrom and to be transferred to a predetermined conductor location.

U.S. Pat. No. 6,155,330 describes a method of spray forming metal deposits. A spray forming pattern of a first metal, having a melting point at a first temperature, is formed with a surface defining a cavity that has the shape of a master pattern. Steel particles are sprayed onto the spray forming pattern to form a deposit on the spray forming pattern. The spraying conditions are controlled so that the steel particles coming into contact with the spray forming pattern results in a surface temperature of the spray forming pattern of less than about 80° C. The deposit and the spray forming pattern are heated to melt the spray forming pattern from the deposit. The resulting deposit has the general shape of the master pattern.

SUMMARY

Embodiments of the present invention that are described hereinbelow provide improved methods and apparatus for printing of three-dimensional (3D) structures.

There is therefore provided, in accordance with an embodiment of the invention, a method for fabrication, which includes providing a substrate having an upper surface with pattern of one or more recesses formed therein. A laser beam is directed to impinge on a donor film so as to eject droplets of a fluid from the donor film by laser-induced forward transfer (LIFT) into the one or more recesses. The fluid hardens within the one or more recesses to form a solid piece having a shape defined by the one or more recesses. The substrate is removed from the solid piece.

In some embodiments, the donor film includes a metal film, such that the droplets of the fluid include molten metal. Additionally or alternatively, the donor film includes a semiconductor material, such that the droplets of the fluid include the semiconductor material in a molten form. Further additionally or alternatively, the donor film includes a dielectric material, such that the droplets of the fluid include the dielectric material in a molten form. In another embodiment, the donor film includes a rheological material, such that the droplets of the fluid include the rheological material in a fluid form.

In a disclosed embodiment, the method includes curing the fluid within the recesses. Additionally or alternatively, the method includes, after forming the solid piece, applying energy in order to modify a material property of the solid piece.

The one or more recesses can have a dimension that is less than 1 mm.

In a disclosed embodiment, the substrate includes a semiconductor wafer, and providing the substrate includes patterning and etching at least one surface layer on the semiconductor wafer in order to define the one or more recesses.

In some embodiments, removing the substrate includes inducing a decomposition of the substrate, for example by selectively etching the substrate away from the solid piece.

In a disclosed embodiment, providing the substrate includes coating the one or more recesses with a thin-film layer before ejecting the droplets into the one or more recesses, such that the thin-film layer remains as an outer surface of the solid piece after removing the substrate.

Typically, directing the laser beam includes holding the donor film at a distance of at least 100 µm from the substrate while ejecting the droplets.

In one embodiment, directing the laser beam includes ejecting first droplets of a first fluid and second droplets of a second fluid, having a composition different from the first fluid, into the one or more recesses from different, respective donor film areas.

There is also provided, in accordance with an embodiment of the invention, a method for fabrication, which includes providing a substrate having an upper surface with pattern of one or more recesses formed therein. The one or more recesses are coated with a thin-film layer. Droplets of a fluid are injected into the one or more coated recesses. The fluid hardens within the one or more coated recesses to form a solid piece having a shape defined by the one or more recesses. The substrate is removed from the solid piece, while the thin-film layer remains as an outer surface of the solid piece after removing the substrate.

In a disclosed embodiment, the thin-film layer includes a metal. The thin-film layer and the injected droplets can include the same or different materials.

In another embodiment, coating the one or more recesses includes applying the thin-film layer to the substrate with a first adhesion that is weaker than a second adhesion between the hardened fluid and the thin-film layer, and removing the substrate from the solid piece includes pulling the solid piece, with the thin-film layer adhering thereto, out of the one or more recesses.

There is additionally provided, in accordance with an embodiment of the invention, fabrication apparatus, including a deposition station, which includes a transparent donor substrate having a donor film deposited thereon, and a positioning assembly, which is configured to position the donor substrate in proximity to an upper surface of an acceptor substrate having a pattern of one or more recesses formed in the upper surface. An optical assembly includes a laser, which is configured to direct a laser beam to impinge on the donor film so as to eject droplets of a fluid from the donor film by laser-induced forward transfer (LIFT) into the one or more recesses, wherein the fluid hardens within the one or more recesses to form a solid piece having a shape defined by the one or more recesses. A release station is configured to release the substrate from the solid piece.

There is further provided, in accordance with an embodiment of the invention, fabrication apparatus, including a coating station, which is configured to receive an acceptor substrate having an upper surface with pattern of one or more recesses formed therein and to coat at least the one or more recesses in the acceptor substrate with a thin-film layer. A deposition station is configured to inject droplets of a fluid into the one or more recesses of the acceptor substrate after coating of the one or more recesses, wherein the fluid hardens within the one or more coated recesses to form a solid piece having a shape defined by the one or more recesses. A release station, which is configured to release the substrate from the solid piece, while the thin-film layer remains as an outer surface of the solid piece after removing the substrate.

The present invention will be more fully understood from the following detailed description of the embodiments thereof, taken together with the drawings in which:

DETAILED DESCRIPTION OF EMBODIMENTS

Figure 1:
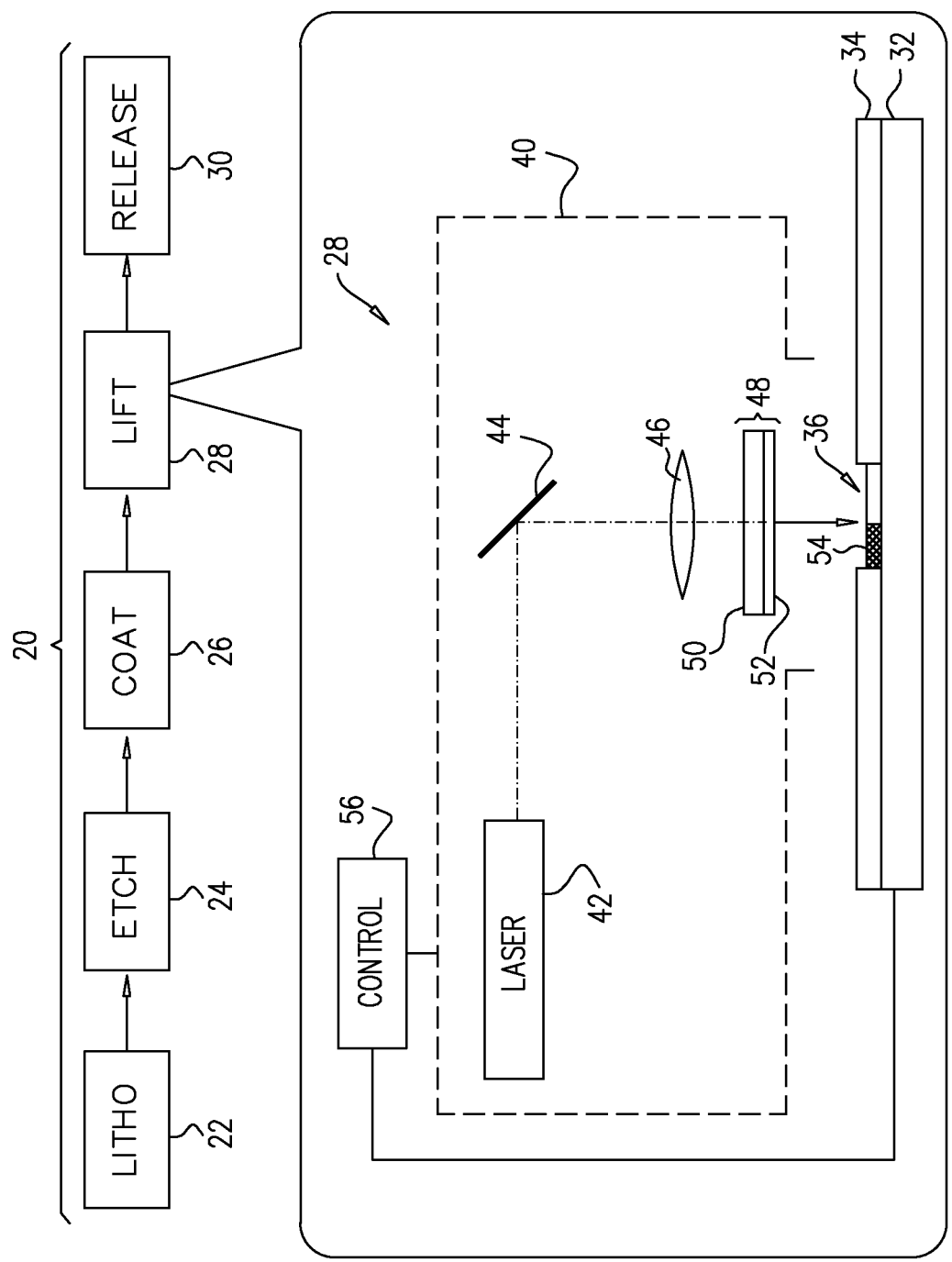
FIG. 1 is schematic side view and block diagram of a system for 3D printing, in accordance with an embodiment of the present invention.

Known methods of 3D printing (including inkjet methods, fused deposition modeling [FDM], stereolithography, and LIFT) are based on deposition of successive layers of material on a flat surface until the desired 3D structure is built up. Using this approach, it can be difficult to obtain the desired surface quality.

Embodiments of the present invention address this problem by printing into a patterned substrate, such as a patterned semiconductor substrate, which serves as a mold. In this case, droplets of an appropriate fluid are injected into the recess or recesses of the mold. The droplets then harden into the shape of the mold, after which the substrate is decomposed (for example, by etching) or otherwise removed, leaving the solid end-product. In some embodiments, the droplets are ejected from a donor sheet by LIFT. LIFT-based molding of this sort is useful not only for making metal parts, but also for other materials with high melting temperatures (much greater than room temperature), including suitable semiconductor, dielectric and phase-change materials, which become molten during LIFT jetting and then readily solidify on the mold surfaces, in either amorphous or crystalline form.

Alternatively or additionally, the injected droplets may comprise polymers or curable monomeric or oligomeric liquids, which are ejected by inkjet or LIFT and are then hardened thermally or by a photonic process, for example. Embodiments of this sort can be applied, inter alia, in printing of photo-curable adhesives (both conductive and non-conductive), solutions containing metal or dielectric particles, and other sorts of polymeric solutions.

For better control of surface quality of the end-product, in some embodiments the substrate is plated or otherwise coated with an initial thin-film layer before the mold is filled. After the mold is filled and the substrate is removed, this initial layer remains as the outer layer of the end product. In this case, the high quality of the mold surfaces determines the surface quality of the printed end product, which can be considerably finer and smoother that the surface quality achievable by LIFT alone. (In LIFT printing, the molten droplets flatten and blend together after landing on the acceptor surface, but small voids still remain between the droplets, and the surface quality is typically limited to a roughness of 2-3 µm unless polished after LIFT printing). The coating material may comprise the same material as the injected fluid or a different material or combination of materials. For example, a part produced by LIFT injection of copper into a mold may have a gold coating applied in this manner, thus providing a surface that is not only smooth, but also has enhanced environmental compatibility.

The techniques described herein can be used to produce, quickly and economically, high-quality small parts (on a scale from tens of microns to a few millimeters, for example) with substantially any closed 3D shape from a wide range of different materials and combinations of materials. The resulting parts can have very fine surface quality and can be made in a variety of shapes that are not readily achievable by conventional molding and 3D printing processes, including shapes with sharp corners and inclusions. Since the coating (if required) is applied to the mold substrate before droplet injection, in many cases there will be no need to coat the end-product after fabrication. As noted earlier, when rheological or polymeric materials are injected into the mold, thermal or photonic curing may be applied as a part of the manufacturing process. Additionally or alternatively, energy may be applied to molded pieces made by the processes described above in order to modify their material properties, for example, annealing (re-melting) to produce a more continuous solid.

Figure 2A:
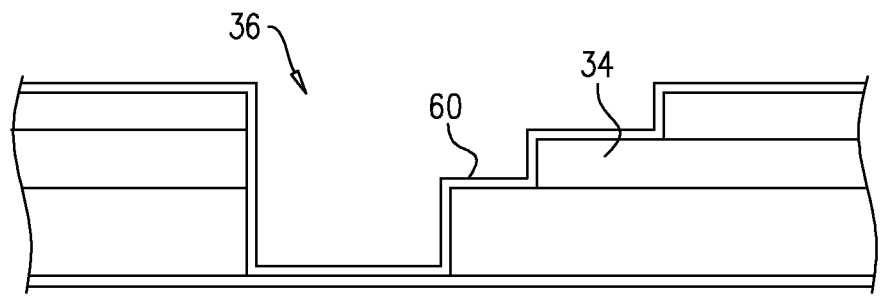
FIG. 2A is a schematic sectional view of a substrate in which a recess has been prepared for 3D printing, in accordance with an embodiment of the invention.
Figure 2B:
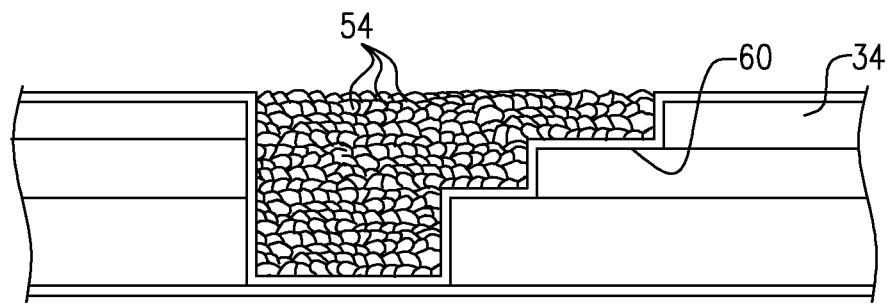
FIG. 2B is a schematic sectional view of the substrate of FIG. 2A following printing of a 3D structure in the recess, in accordance with an embodiment of the invention.
Figure 2C:
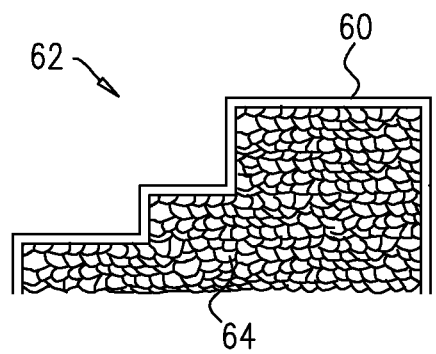
FIG. 2C is a schematic sectional view of the 3D structure of FIG. 2B following removal of the substrate, in accordance with an embodiment of the invention.

Reference is now made to FIGS. 1 and 2A-C, which schematically illustrate a 3D printing process, in accordance with an embodiment of the invention. FIG. 1 is a block diagram and side view of a system 20 for 3D printing, while FIGS. 2A-C are sectional views showing stages in the printing of a 3D structure.

System 20 comprises a lithography station 22, an etching station 24, and a coating station 26, which together serve as a substrate preparation subsystem. A substrate 34 in this example comprises a semiconductor wafer, which is patterned and etched to define one or more recesses 36, which are used as a mold in a deposition station 28, which injects droplets 54 of a fluid into the mold. After the droplets in the mold have hardened into a solid piece, a release station 30 releases the substrate from the solid piece. For example, release station may induce decomposition of the substrate by selectively etching the substrate away from the solid piece, typically by chemical dissolution, or by a thermal process. Optionally, the molded material is cured (by radiation or heating) or annealed before or after the substrate is released by station 30.

In an alternative embodiment, release station 30 releases substrate 34 without decomposition when the adhesion of the printed material to the surface is low enough. For example, when a metal (such as copper) is printed or otherwise deposited into recesses in a glass or polymer substrate, or even into recesses in a metal substrate having an oxidized surface layer, it is possible to release the solid piece of metal from the recess simply by pulling it out.

In the pictured embodiment, deposition station 28 uses a LIFT process to inject molten droplets 54 of a material into the mold, as described in detail hereinbelow. Further aspects of a LIFT system similar to that shown here are described, for example, in PCT International Publication WO 2015/155662, whose disclosure is incorporated herein by reference.

The other functions of system 20 can be implemented using commonly-available semiconductor process equipment and techniques. In lithography station 22, a semiconductor wafer is coated with a photoresist, such as SU-8 photoresist, and a pattern corresponding to the desired mold is written in the photoresist using a suitable mask or direct-write technique. Etching station 24 then removes the unexposed photoresist (or the exposed photoresist, depending on the type of photoresist that is used) to leave the mold pattern in the form of recesses in the hardened photoresist. The steps of coating, writing, and etching of photoresist may be repeated one or more times to create multiple overlying pattern layers, which together define a complex 3D mold shape. FIG. 2A is a schematic sectional view of substrate 34 following a process of this sort, in which a complex recess 36 has been prepared for 3D printing, by successive coating, writing and etching of multiple photoresist layers.

Alternatively, any other suitable technique that is known in the art may be used to create the desired pattern of recesses in the substrate. For example, a layer of a suitable polymer or resin on the substrate may be directly patterned by laser ablation. Polymers with good ablation properties for this purpose include, for example, polyvinyl alcohol (PVA), polyvinyl butyral (PVB) and QPAC® polypropylene carbonate, which can be cleanly removed with minimal residues upon laser ablation in release station 30.

As another example, the silicon wafer substrate may itself be etched to serve as the mold for 3D LIFT printing. The silicon mold can similarly be patterned using methods that are known in the microelectronics art, such as by photolithography. Selective etching of the silicon after LIFT printing allows controlled, selective removal of the silicon mold without affecting the printed part.

Metal structures can also be used as substrate 34 for 3D LIFT printing in deposition station 28, as long as the metal from which the mold is made can be selectively etched away afterwards or otherwise removed in release station 30. The etching process is chosen so that it affects only the mold and not the 3D-printed product. For example, recesses in an aluminum mold may be coated and then filled by LIFT printing with another metal, such as copper. The aluminum is then selectively etched away using an appropriate basic solution (for example, concentrated KOH solution) without affecting the formed metal part.

In many cases, it is desirable that substrate 34 have low heat conductance and low heat capacity, so that molten droplets 54 injected into recesses 36 cool relatively slowly and thus have more time to fill the shape of the recesses before they solidify. For this purpose, it can be advantageous to use a dielectric substrate with low heat conductance and low heat capacity. In this respect, the thickness of the surface coating of recesses 36 (as described below) can also play a role, since a thick metal coating, for example, will enhance heat conduction and thus cause faster cooling of the droplets in the recesses.

After substrate 34 has been patterned in etching station 24, coating station 26 then coats the surface of the substrate, including the inner surface of recesses 36 of the pattern, with a thin-film coating 60, as shown in FIG. 2A. The thin film may be applied by any suitable technique that is known in the art, such as electro- or electroless plating, sputtering, or vapor deposition, in order to create thin, highly-smooth surfaces. The thin-film coating may comprise a metal or dielectric material, and may comprise a material similar to the material that is to be injected by LIFT station 28 or some other material (or combination of materials), depending on application requirements. Metal coating materials that can be used in coating 60 include, for example, copper, silver, nickel and gold, as well as alloys of such metals, such as NiP and CuW or NiW. The operation of coating station 26 in system 20 is optional; and in some embodiments, droplets are injected directly into the recesses in the pattern on the surface of the substrate, without prior coating of the recesses.

In some embodiments, coating 60 can be chosen and applied to the inner surface of recesses 36 in a manner that will facilitate subsequent removal of the hardened solid piece from substrate 34, without decomposition of the substrate. For example, as noted above, if a metal coating, such as gold or silver, is deposited on a glass, polymer, or oxidized metal substrate, the adhesion between the coating and the substrate will be relatively weak. On the other hand, the metal droplets, comprising copper, for example, that are afterwards injected into the coated recesses will adhere strongly to the metal coating. In such a situation, when the hardened metal pieces are pulled out of the recesses, coating 60 will freely detach from the substrate and remain as the outer surface of the metal pieces.

Coating 60 may be chosen and adapted for various purposes. As noted above, the coating is useful in providing a smooth surface finish on the LIFT-printed product. Additionally or alternatively, the coating may provide an inert surface layer, such as a biocompatible layer in medical products. For example, titanium and gold have desirable properties in this regard. Therefore, in one embodiment, layer 60 comprises titanium or gold, while the LIFT-printed material is chosen from a range of printable metals with desired mechanical and thermal properties, such as aluminum, copper, nickel, tin, or alloys of these metals.

As another option, coating 60 may provide a low-friction outer layer, while the bulk 3D-printed material has the required mechanical properties such as material strength and plasticity. Certain copper alloys, for example, have low coefficients of friction and can be used in coating 60 for this purpose.

More generally, the pair of materials—coating and fill—may be chosen such that their properties are complementary. Examples of such paired properties include a low-friction coating with a fill material that has high heat conductivity; a strong, inert coating with a lightweight fill material; and an insulating coating over a metal fill material.

As shown in the side view in FIG. 1, substrate 34, with a pattern of one or more recesses 36 formed in the upper surface, serves as the acceptor substrate in LIFT station 28. Recesses 36 are thus filled with droplets 54, as illustrated in FIG. 2B. For this purpose, LIFT station 28 comprises an optical assembly 40, in which a laser 42 emits pulsed radiation, which is focused by suitable optics 46 onto a LIFT donor sheet 48. Donor sheet 48 comprises a transparent donor substrate 50 having a donor film 52 deposited thereon. A positioning assembly 32 positions donor substrate 50 and/or acceptor substrate 34 so that the donor substrate is in proximity to the upper surface of the acceptor substrate, with donor film 52 facing toward the acceptor substrate and a small gap in between (typically no more than a few hundred microns, and possibly less). Although positioning assembly 32 is shown in FIG. 1, for the sake of simplicity, as a basic X-Y-Z stage below acceptor substrate 34, in practice the positioning assembly in LIFT station 28 additionally or alternatively may be capable of positioning donor substrate 50 and/or elements of optical assembly 40, as will be apparent to those skilled in the art.

Donor substrate 50 typically comprises a glass or plastic sheet or other suitable transparent material, while donor film 52 comprises a suitable donor material, such as a metal (or metal alloy), semiconductor, dielectric, or rheological material, or a combination of such materials. Typically, the thickness of the donor film is no more than a few microns.

Optics 46 focus the beam from laser 42 to pass through the outer surface of donor substrate 50 and to impinge on donor film 52, thereby causing droplets 54 of a fluid to be ejected from film 52 and fly across the gap into recesses 36 in acceptor substrate 34. The fluid comprises a molten form of the material in donor film 52, which then hardens within recesses 36 to form a solid piece having a shape defined by the recesses.

Laser 42 comprises, for example, a pulsed Nd:YAG laser with frequency-doubled output, which permits the pulse amplitude to be controlled conveniently by a control unit 56. Typically, control unit 56 comprises a general-purpose computer, with suitable interfaces for controlling and receiving feedback from optical assembly 40, motion assembly 32, and other elements of LIFT station 28. The inventors have found that for good LIFT deposition results, the optimal pulse duration is in the range of 0.1 ns to 1 ns, but longer or shorter pulses may be used, depending on application requirements. Optics 46 are similarly controllable in order to adjust the size of the focal spot formed by the laser beam on donor film 52.

The size of droplets 54 is determined, inter alia, by the laser pulse energy, duration, and focal spot size and the thickness of the donor film. The above-mentioned PCT International Publication WO 2015/155662 describes LIFT techniques and parameters that can be applied so that each laser pulse causes a single, relatively large droplet to be ejected from the donor film. These techniques and parameters can be applied advantageously in LIFT station 28, since the large, energetic droplets that are injected into recesses 36 in this manner cool relatively slowly and thus have more time to fill the shape of the recesses before they solidify. A further advantage of operating in this single-droplet regime is that the droplets are ejected toward acceptor substrate 34 with accurate directionality, making it possible to hold donor film 52 at a distance of at least 100 µm from the acceptor substrate during ejection of the droplets and to fill even deep recesses—possibly as deep as 1 mm—with precision.

In some embodiments, LIFT station 28 causes droplets of two or more different fluids, having different compositions, to be ejected into recesses 36. Typically, the different fluids are ejected by directing laser 42 to impinge on different areas of donor film 52 (either on the same donor substrate 50 or different donor substrates) containing different materials. The different fluids may be injected sequentially into the same recess in acceptor substrate 34 or into different recesses, depending the desired properties of the end-product. The ability to mix materials in this manner, in substantially any desired pattern and gradation, is a marked advantage of the present technique in comparison with methods of fabrication that are known in the art.

A scanner 44, such as a rotating mirror and/or an acousto-optic beam deflector under control of control unit 56, scans the laser beam so as to irradiate different spots on donor film 52. Control unit 56 thus controls optical assembly 40 so as to write donor material from film 52 over the locus of recesses 36 on substrate 34 and to make multiple passes, as needed, in order to build up the deposited volume of the donor material to the desired thickness. For example, LIFT station 28 may operate in this manner to produce solid pieces with one or more dimensions (height, width, and thickness) that are less than 1 mm. At least one of these dimensions may be less than 100 µm, and in some cases less than 10 µm, thus creating miniature (or even microscopic) pieces of precise shape and surface quality.

After recesses 36 have been filled to the desired level with droplets 54, as shown in FIG. 2B, and the droplets have hardened into a solid, release station 30 removes substrate 34, for example by a suitable chemical etching process or other decomposition technique, or simply by mechanical pulling when adhesion is weak, as mentioned above. FIG. 2C is a schematic sectional view of a 3D structure 62 that remains following removal of the substrate, in accordance with an embodiment of the invention. The droplets injected into recess 36 have hardened into a solid bulk 64 (possibly following an additional curing or annealing step), and coating 60 serves as the outer surface of structure 62, with the desired surface properties.

In many applications, fine surface quality is required on only one or a few of the surfaces of the end-product, and therefore 3D structure 62 may be used as-is when released from substrate 34. Alternatively, the rough open surface of structure 62 may be polished, for example by a suitable chemical or electrochemical polishing process. Further alternatively or additionally, an additional coating layer may be applied, if necessary, over the open surface of bulk 64 (at the lower side of structure 62 in FIG. 2C), possibly even before the structure is released from substrate 34, so that all sides of the end-product have the desired surface properties.

System 20 may comprise additional elements (omitted from the figures for the sake of simplicity), such as an operator terminal, which can be used by an operator to set the functions of the system, and an inspection assembly, for monitoring the deposition process. These and other ancillary elements of system 20 will be apparent to those skilled in the art and are omitted from the present description for the sake of simplicity.

Reference is now made to FIGS. 3A-3E, which are schematic sectional views showing successive stages in a 3D printing process, in accordance with an alternative embodiment of the invention. The process of FIGS. 3A-3E represents one possible implementation of the principles of fabricating 3D structures that are described above.

Figure 3A:
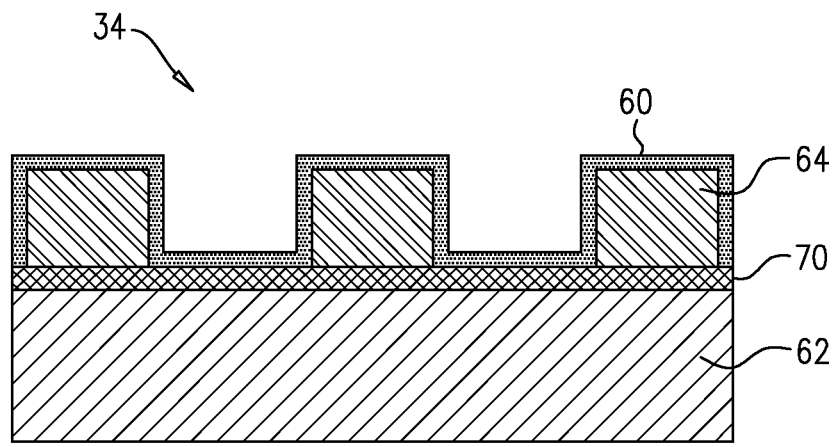
FIG. 3A is a schematic sectional view of a substrate with a patterned layer in which recesses have been prepared for 3D printing, in accordance with another embodiment of the invention.

As shown in FIG. 3A, to produce substrate 34 in this embodiment, a sacrificial layer 70 is deposited over the surface of a wafer 62, and a pattern 64 is then deposited over the sacrificial layer. As described above, pattern 64 typically comprises a suitable photoresist, which is patterned and etched in lithography station 22 and etching station 24, and is then covered in coating station 26 by coating 60. In the present embodiment, however, the photoresist is not coated directly onto wafer 62 before patterning, but rather over sacrificial layer 70, which separates wafer 62 from the structure that is to be printed in pattern 64.

Sacrificial layer 70 is typically a thin layer with properties that allow it to be selectively removed (in release station 30) by a solvent and/or physical processing, but is still stable enough to accept coating 60 (by sputtering or evaporation) with good surface quality. Sacrificial layer 70 may comprise, for example, a soluble polymer, such as PVA, or a polymer that can be thermally evaporated, such as QPAC, or a soluble dielectric, such as TiWN, which can be selectively removed in $H_2O_2$.

Figure 3B:
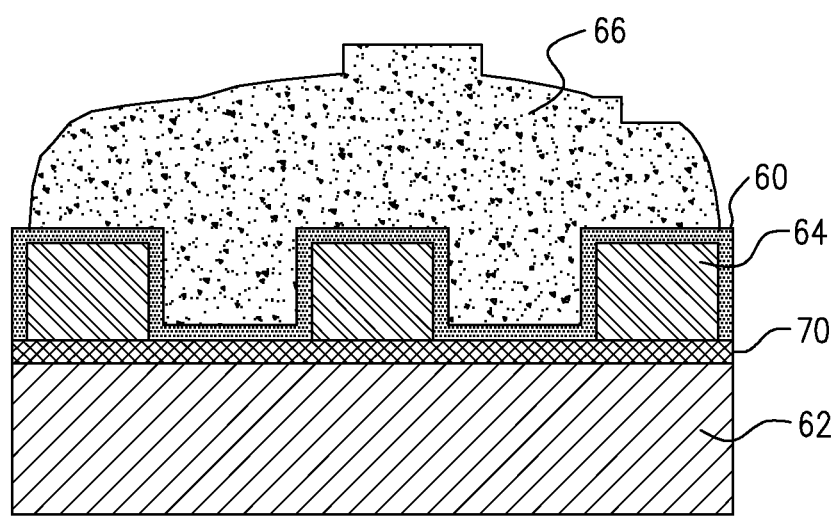
FIG. 3B is a schematic sectional view of the substrate of FIG. 3A following printing of a 3D structure in the recesses, in accordance with an embodiment of the invention.
Figure 3C:
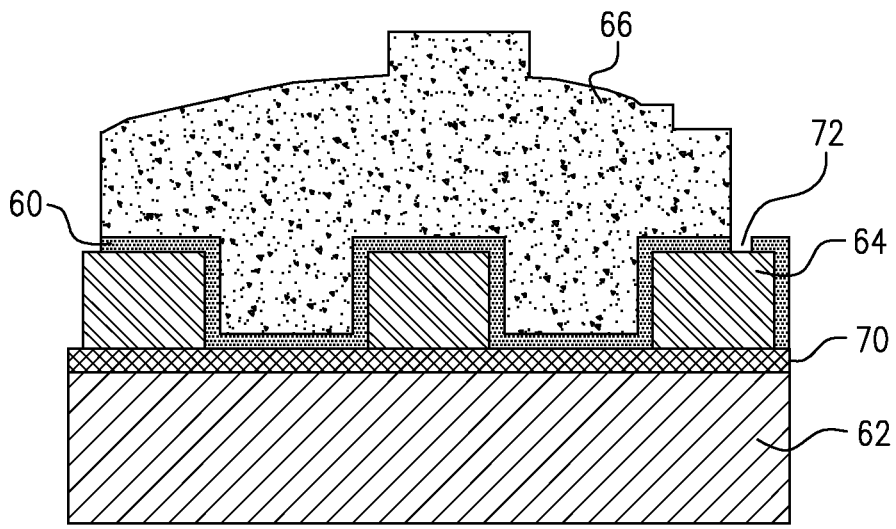
FIG. 3C is a schematic sectional view of the 3D structure of FIG. 3B in the course of trimming a coating layer from the patterned layer, in accordance with an embodiment of the invention.
Figure 3D:
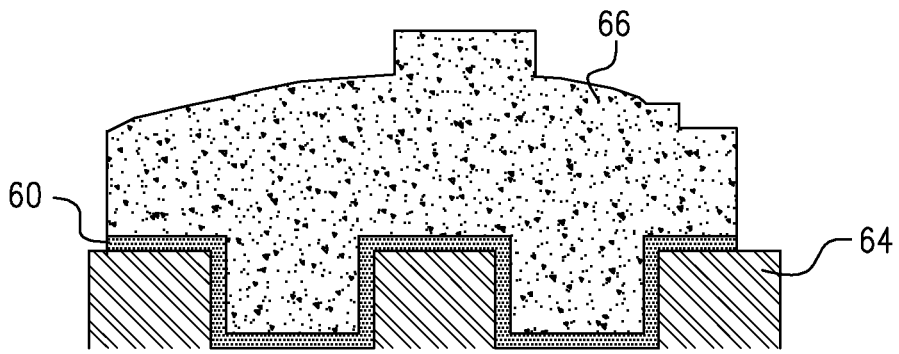
FIG. 3D is a schematic sectional view of the 3D structure of FIG. 3C following removal of the substrate, in accordance with an embodiment of the invention.
Figure 3E:
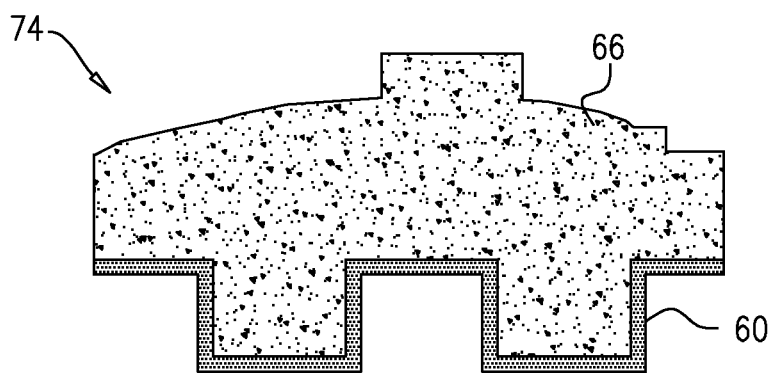
FIG. 3E is a schematic sectional view of the 3D structure of FIG. 3D following removal of the patterned layer, in accordance with an embodiment of the invention.

As shown in FIG. 3B, droplets of a fluid are injected into the recesses in pattern 64 and thus deposited over coating 60, as described above, and in this manner build up a 3D structure 66 that fills the recesses in pattern 64. The shape of the upper surface of structure 66 is determined by the pattern of printing that is applied in LIFT station 28. After printing, the excess material in structure 66 and coating 60 that extends beyond the desired bounds of structure 66 is then trimmed, straightening the sides of structure 66 and creating gaps 72 in the coating, as shown in FIG. 3C. This trimming step may be performed, for example, by laser ablation. At this stage, sacrificial layer 70 is removed, by a chemical or thermal process, for example, thus freeing structure 66, together with pattern 64, from wafer 62, as shown in FIG. 3D. Finally, as shown in FIG. 3E, pattern 64 is removed, as well, by chemical and/or physical etching of the photoresist that was used to create the pattern, for example. The result is an end-product 74, with a surface defined by coating 60, as described above.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for fabrication, comprising:
   providing a substrate having an upper surface with pattern of one or more recesses formed therein;
   directing a laser beam to impinge on a donor film so as to eject droplets of a fluid from the donor film by laser-induced forward transfer (LIFT) into the one or more recesses, wherein the fluid hardens within the one or more recesses to form a solid piece having a shape defined by the one or more recesses; and
   removing the substrate from the solid piece,
   wherein providing the substrate comprises coating the one or more recesses with a thin-film layer before ejecting the droplets into the one or more recesses, such that the thin-film layer remains as an outer surface of the solid piece after removing the substrate.

2. The method according to claim 1, wherein the donor film comprises a metal film, such that the droplets of the fluid comprise molten metal.

3. The method according to claim 1, wherein the donor film comprises a semiconductor material, such that the droplets of the fluid comprise the semiconductor material in a molten form.

4. The method according to claim 1, wherein the donor film comprises a dielectric material, such that the droplets of the fluid comprise the dielectric material in a molten form.

5. The method according to claim 1, wherein the donor film comprises a rheological material, such that the droplets of the fluid comprise the rheological material in a fluid form.

6. The method according to claim 1, and comprising curing the fluid within the recesses.

7. The method according to claim 1, and comprising, after forming the solid piece, applying energy in order to modify a material property of the solid piece.

8. The method according to claim 1, wherein the one or more recesses have a dimension that is less than 1 mm.

9. The method according to claim 1, wherein the substrate comprises a semiconductor wafer, and wherein providing the substrate comprises patterning and etching at least one surface layer on the semiconductor wafer in order to define the one or more recesses.

10. The method according to claim 1, wherein removing the substrate comprises inducing a decomposition of the substrate.

11. The method according to claim 10, wherein inducing the decomposition comprises selectively etching the substrate away from the solid piece.

12. The method according to claim 1, wherein directing the laser beam comprises holding the donor film at a distance of at least 100 μm from the substrate while ejecting the droplets.

13. The method according to claim 1, wherein directing the laser beam comprises ejecting first droplets of a first fluid and second droplets of a second fluid, having a composition different from the first fluid, into the one or more recesses from different, respective donor film areas.

14. A method for fabrication, comprising:
   providing a substrate having an upper surface with pattern of one or more recesses formed therein;
   coating the one or more recesses with a thin-film layer;
   injecting droplets of a fluid into the one or more coated recesses, wherein the fluid hardens within the one or more coated recesses to form a solid piece having a shape defined by the one or more recesses; and
   removing the substrate from the solid piece, while the thin-film layer remains as an outer surface of the solid piece after removing the substrate.

15. The method according to claim 14, wherein the thin-film layer comprises a metal.

16. The method according to claim 14, wherein the thin-film layer and the injected droplets comprise the same material.

17. The method according to claim 14, wherein the thin-film layer and the droplets comprise different materials.

18. The method according to claim 14, wherein the injected droplets comprise a metallic material.

19. The method according to claim 14, wherein the injected droplets comprise a semiconductor material.

20. The method according to claim 14, wherein the injected droplets comprise a dielectric material.

21. The method according to claim 14, wherein the injected droplets comprise a rheological material.

22. The method according to claim 14, and comprising curing the hardened fluid.

23. The method according to claim 14, wherein the substrate comprises a semiconductor wafer, and wherein providing the substrate comprises patterning and etching at least one surface layer on the semiconductor wafer in order to define the one or more recesses.

24. The method according to claim 14, wherein removing the substrate comprises selectively etching the substrate away from the solid piece.

25. The method according to claim 14, wherein coating the one or more recesses comprises applying the thin-film layer to the substrate with a first adhesion that is weaker than a second adhesion between the hardened fluid and the thin-film layer, and wherein removing the substrate from the solid piece comprises pulling the solid piece, with the thin-film layer adhering thereto, out of the one or more recesses.

26. The method according to claim 14, wherein the one or more recesses have a dimension that is less than 1 mm.

* * * * *